United States Patent
Gerten et al.

(10) Patent No.: US 11,579,177 B2
(45) Date of Patent: Feb. 14, 2023

(54) PORTABLE ANECHOIC CHAMBER

(71) Applicant: Orolia Defense & Security LLC, Rochester, NY (US)

(72) Inventors: Gregory Gerten, Marysville, OH (US); Tyler Hohman, Columbus, OH (US); Timothy Erbes, Ankeny, IA (US); Christopher Kiedrowicz, Dublin, OH (US)

(73) Assignee: Orolia Defense & Security LLC, Rochester, NY (US)

( * ) Notice: Subject to any disclaimer, the term of this patent is extended or adjusted under 35 U.S.C. 154(b) by 439 days.

(21) Appl. No.: 16/912,761

(22) Filed: Jun. 26, 2020

(65) Prior Publication Data
US 2020/0408823 A1 Dec. 31, 2020

Related U.S. Application Data

(60) Provisional application No. 62/868,547, filed on Jun. 28, 2019.

(51) Int. Cl.
*G01R 31/00* (2006.01)
*G01R 29/08* (2006.01)
*G01R 1/18* (2006.01)

(52) U.S. Cl.
CPC ....... *G01R 29/0821* (2013.01); *G01R 31/001* (2013.01); *G01R 1/18* (2013.01)

(58) Field of Classification Search
CPC .. G01R 29/10; G01R 29/105; G01R 29/0814; G01R 29/0821; G01R 29/0878;
(Continued)

(56) References Cited

U.S. PATENT DOCUMENTS 3,290,598 A   12/1966   Thomas
3,806,943 A    4/1974   Holloway
(Continued)

FOREIGN PATENT DOCUMENTS

AU   2015240437 A1   10/2016
CA      2944203 A1   10/2015
(Continued)

OTHER PUBLICATIONS

International Search Report and Written Opinion from PCT/US2020/039780 dated Oct. 15, 2020.
(Continued)

*Primary Examiner* — Thang X Le
(74) *Attorney, Agent, or Firm* — Calfee, Halter & Griswold LLP (57) ABSTRACT

An anechoic chamber and test system that is adapted for installation in or to a vehicle. The chamber includes an outer structure that is durable enough to withstand the effects of transportation. The anechoic chamber and test system may also include an inner faraday shield, a transmission antenna, and a controller that can introduce GNSS, alternative navigation signals, jamming, or spoofing signals into the anechoic chamber along with vehicle sensor signals. The controller is adapted to monitor a GNSS system's ability to resist the jamming or spoofing signals using, at least in part, the vehicle sensor signals.

20 Claims, 10 Drawing Sheets

(58) Field of Classification Search
CPC ............ G01R 29/0892; G01R 29/0871; G01R 31/001; G01R 1/0018; G01S 19/015; G01S 19/21; G01S 19/215; G01S 19/23
See application file for complete search history.

(56) References Cited

U.S. PATENT DOCUMENTS

| | | | |
|---|---|---|---|
| 3,955,199 | A | 5/1976 | Hutzelman et al. |
| 5,134,405 | A | 7/1992 | Ishihara et al. |
| 6,497,442 | B1 | 12/2002 | Wacker |
| 6,885,348 | B1 | 4/2005 | Ryken, Jr. et al. |
| 7,170,457 | B2 | 1/2007 | Tsai et al. |
| 7,190,301 | B2 | 3/2007 | Krenz et al. |
| 9,213,053 | B2 | 12/2015 | Nicket et al. |
| 9,244,105 | B2 | 1/2016 | Aubin et al. |
| 9,433,136 | B2 | 8/2016 | Morimoto et al. |
| 10,054,623 | B2 | 8/2018 | Estebe et al. |
| 2002/0053989 | A1 | 5/2002 | Lin et al. |
| 2005/0253762 | A1 | 11/2005 | Tsai et al. |
| 2006/0132355 | A1 | 6/2006 | Krenz et al. |
| 2012/0139571 | A1 | 6/2012 | Nickel et al. |
| 2014/0300519 | A1 | 10/2014 | Estebe et al. |
| 2014/0375500 | A1* | 12/2014 | Wang ............... G01S 19/21 342/357.59 |
| 2015/0234053 | A1* | 8/2015 | Psiaki ............... H04K 3/90 342/357.51 |
| 2015/0250772 | A1 | 9/2015 | Kangas et al. |
| 2015/0301185 | A1* | 10/2015 | Shin ............... G01S 19/23 342/357.62 |
| 2016/0212891 | A1 | 7/2016 | Morimoto et al. |
| 2017/0115334 | A1 | 4/2017 | Symes |
| 2018/0321292 | A1 | 11/2018 | Bartko et al. |
| 2019/0339353 | A1* | 11/2019 | Egg ............... G01S 5/0294 |

FOREIGN PATENT DOCUMENTS

| | | |
|---|---|---|
| CN | 108802505 A | 11/2018 |
| EP | 1808703 A1 | 7/2007 |
| EP | 2734851 A1 | 5/2014 |
| EP | 3127188 A1 | 2/2017 |
| FR | 2978249 A1 | 1/2013 |
| GB | 2414084 A | 11/2005 |
| IN | 501/DELNP/2014 | 1/2015 |
| JP | 2006153841 A | 6/2006 |
| JP | 5553951 B1 | 7/2014 |
| KR | 20060047729 A | 5/2006 |
| KR | 20160016901 A | 2/2016 |
| NO | 20072827 L | 7/2007 |
| TW | 200538027 A | 11/2005 |
| WO | 2006049017 A1 | 5/2006 |
| WO | 2013014065 A1 | 1/2013 |
| WO | 2014197017 A1 | 12/2014 |
| WO | 2015049760 A1 | 4/2015 |
| WO | 2015149133 A1 | 10/2015 |

OTHER PUBLICATIONS

Boasman et al., T"he Development of an Anechoic GPS Test Facility", 58th AM—Proceedings of the 58th Annual Meeing of the Institute of Navigation and CIGTF 21st Guidance Test Symposium, The Institute of Navigaiion, Jun. 26, 2002, pp. 483-494, XP056006211.
Borio et al., "GNSS Jammers: Effects and Countermeasures", Satellite Navigatio Technogoies and European Workshop on GNSS Signals and Signal Processing, (NAVITEC) 2012 6th ESA Workshop, IEEE, Dec. 5, 2012, pp. 1-7, XP032322217.
Strauss et al.,"Read range measurements of UHF RFID transponders in mobile anechoic chamber", RFID, 2009 IEEE International Conferennce, Apr. 27, 2009, pp. 48-55, XP031573179.
Eckel Noise Control Technologies—Portable Anechoic Chambers https://eckelusa.com/Anechoic%20box/portable-anechoic-chambers/ (downloaded May 25, 2021).
Abdullah et al., "Design of portable mini anechoic chamber using low cost composite absorber," 2009 IEEE Student Conference on Research and Development (SCOReD), 2009, pp. 526-528, doi: 10.1109/SCORED.2009.5442944.
Viebrock, et al. Miniature anechoic room design, Journal of Sound and Vibration, vol. 32, Issue 1,1974, p. 77-IN2, ISSN 0022-460X, https://doi.org/10.1016/S0022-460X(74)80019-2. (https://www.sciencedirect.com/science/article/pii/S0022460X74800192).

* cited by examiner

PORTABLE ANECHOIC CHAMBER

CROSS-REFERENCE TO RELATED APPLICATION

This application claims the benefit of U.S. Provisional Patent Application Ser. No. 62/868,547, filed Jun. 28, 2019, the priority of which is hereby claimed and the disclosure of which is incorporated herein by reference in its entirety.

FIELD

The general inventive concepts relate to a portable anechoic chamber adapted for testing global positioning equipment.

BACKGROUND

Global navigation satellite signals (GNSS), e.g., Global Positioning System (GPS) signals, are commonly used to locate and/or guide vehicles or other devices to a destination. In particular, GNSS signals are used by the military to enable precise location and guidance to vehicles and ordinance.

More specifically, GNSS signals, e.g., GPS signals, are used to determine a current location of a device having GNSS receivers, e.g., latitude, longitude, and altitude. Additionally, the current location information provided by GNSS signals when compared to a desired location can be used to provide direction or control to allow a vehicle (or human) to traverse the distance from an initial location to the desired location. A GNSS receiver receives signals from a plurality of GNSS transmitters, e.g., GPS satellite transmitters, that use transmitted frequency and timing data to determine the distance from each satellite to the GNSS receiver. The GNSS receiver then calculates its current location using several of these signals.

Opponents faced by a military using GNSS technology often try to jam or otherwise render the location information provided by a GNSS system ineffective. Thus, to interfere with the ability of the GNSS to determine its location, jamming and spoofing techniques may be used. Jamming refers to the use of "noise signals" (often random transmission data) transmitted on the frequencies used by the GNSS receiver such that the noise signals mask the signals transmitted by the GNSS satellites. Spoofing is similar to jamming except that instead of noise signals, erroneous data is transmitted that can be received and interpreted by the GNSS receiver. Thus, when spoofed, a GNSS receiver may determine that it is present at a location or time when, in fact, it is not actually there or at that time. Either of these techniques can result in the GNSS receiver returning inaccurate location or time data with potentially disastrous results. For example, on 5 Dec. 2011, an American Lockheed Martin RQ-170 Sentinel unmanned aerial vehicle (UAV) was captured by Iranian forces near the city of Kashmar in northeastern Iran supposedly after both jamming and spoofing signals were transmitted to the UAV to confound the UAV navigation systems.

Various technologies and techniques are employed by the designers of GNSS receivers to resist jamming and spoofing. For example, GNSS receivers may be configured to receive vehicle status and other information from a vehicle or device upon which they are deployed. If the position indicated by the GNSS signal doesn't correspond to a position estimated by the use of vehicle data, the GNSS receiver may alert an operator, make corrections, or disregard a position determined from potentially spoofed or jammed satellite signals received by the GNSS.

However, testing the effectiveness of such technologies and techniques is quite costly (e.g., on the order of tens of millions of dollars), requiring an elaborate wide-scale set-up (e.g., a wide open area), extensive manpower (e.g., dozens of personnel), and time-consuming government clearance (one may not legally transmit RF jamming and spoofing signals in the open without formal permission to do so).

SUMMARY

Applicant has realized that a specially configured mobile anechoic chamber can be used to test such new GNSS and other RF equipment rather than using an elaborate wide-scale set-up and extensive manpower.

In an exemplary embodiment, a compartment of a transport vehicle is configured to have an inner chamber that serves to provide the level of RF signal isolation sufficient to isolate a GNSS receiver (or other device under test) from external RF signals and the external environment from the RF signals generated inside the inner chamber. In another exemplary embodiment, a shipping container is configured to have an inner chamber that serves to provide the level of RF signal isolation sufficient to isolate the GNSS receiver or other device under test from external RF signals.

In some exemplary embodiments, a mobile anechoic chamber is configured to include an anechoic enclosure shielded from external electromagnetic radiation and adapted to be transportable using a vehicle, the enclosure including: a first antenna located within the enclosure in communication with a first transmitter; a second antenna located within the enclosure and in communication with a second transmitter; a signal pass-through adapted to pass one or more communications media from outside of the enclosure to within the enclosure; a vehicle condition sensor signal received from outside the enclosure and supplied within the enclosure; and a control computer which is adapted to: receive a first signal from a source of positioning signals; provide to the first transmitter an inside positioning signal corresponding to the first signal for transmission into the chamber via the first antenna; receive a second signal from the vehicle condition sensor signal; and provide a third signal to the second transmitter that interferes with the inside positioning signal for transmission into the chamber via the second antenna.

In some exemplary embodiments, a system for testing the resistance of a device under test to interference includes: an enclosure shielded from external electromagnetic radiation and adapted to function as an anechoic chamber while being transported; a source of global positioning signals with a first transmission antenna located within the enclosure; a source of interference signals with a second transmission antenna located in the interior of the enclosure; at least one vehicle condition signal provided to the interior of the enclosure; and a controller that controls the source of global positioning signals and the source of interference signals, the controller further monitoring the device under test to determine the ability of the device under test to utilize the global positioning signals and the at least one vehicle condition signal to resist the interference signals.

In additional exemplary embodiments, an exemplary method of testing the resistance of a device to radiofrequency (RF) interference includes the steps of: providing a mobile anechoic chamber shielded from external electromagnetic radiation and mounted to a transport vehicle;

installing a device to be tested in the mobile anechoic chamber mounted to the transport vehicle; providing a vehicle condition signal from the vehicle to the device; transmitting to the device inside the mobile anechoic chamber mounted to the transport vehicle an inside positioning signal while the transport vehicle is moving; transmitting to the device inside the mobile anechoic chamber mounted to the transport vehicle an interference signal while the transport vehicle is moving; and monitoring the device to determine its ability to utilize the inside positioning signals and the vehicle condition signal to resist the interference signal inside the mobile anechoic chamber mounted to the transport vehicle while the transport vehicle is moving.

In an exemplary embodiment, a mobile anechoic chamber comprises an anechoic chamber adapted to be transportable using a vehicle, the enclosure comprises a first transmission antenna located within the enclosure in communication with a first transmitter, a second antenna located within the chamber, the second antenna in communication with a second transmitter, a signal pass-through adapted to receive data signals from outside of the enclosure and make those signals available within the enclosure, a source of global positioning signals, and a control computer which is adapted to receive a first signal from the source of global positioning signals, provide the first signal to the first transmitter, receive a second signal from a vehicle condition sensor, provide the second signal from the vehicle condition sensor to the signal pass-through, and provide a third signal to the second transmitter that interferes with the global positioning signals.

An exemplary embodiment is configured to monitor a test receiver disposed within the anechoic chamber to determine if the test receiver detected or rejected the jamming signal or false GNSS signal using other signals, e.g., signals from a transport vehicle.

The above and other aspects and advantages of the general inventive concepts will become more readily apparent from the following description and figures, illustrating by way of example, the principles of the general inventive concepts.

BRIEF DESCRIPTION OF THE DRAWINGS

These and other features of the general inventive concept will become better understood with regard to the following description and accompanying drawings in which.

DETAILED DESCRIPTION

This detailed description merely describes exemplary embodiments of the invention and is not intended to limit the scope of the invention in any way. Indeed, the contemplated invention is broader than the exemplary embodiments. The terms used in any future claims have their full ordinary meaning unless an express definition is provided herein.

As mentioned above, various technologies and techniques have been employed to resist jamming and spoofing. In particular, GNSS receivers may be configured such that they receive vehicle status and other information from a vehicle or device upon which they are deployed. Examples of such status and information may include, but are not limited to, acceleration data, speed data, compass data, altitude, and map data. It will be understood by one of ordinary skill in the art, that the data available is at least somewhat dependent upon the vehicle type. Thus, a GNSS receiver may be adapted to determine its speed and direction data from vehicle sensors and compare to that which is determined from the GNSS signals received and interpreted by the GNSS. If the position indicated by the GNSS signal doesn't correspond to a position estimated by the use of vehicle data, the GNSS receiver may alert an operator, make corrections, or disregard a position determined from potentially spoofed or jammed satellite signals received by the GNSS.

Applicant has realized that a specially configured mobile anechoic chamber can be used to test such new GNSS and other RF equipment rather than using an elaborate wide-scale set-up and extensive manpower.

An exemplary method of testing a device, such as a GNSS receiver, comprises: providing a mobile anechoic chamber shielded from external electromagnetic radiation and mounted to a transport vehicle; installing a device to be tested in the mobile anechoic chamber mounted to the transport vehicle; providing a vehicle condition signal from the vehicle to the device; while the transport vehicle is moving, transmitting to the device inside the mobile anechoic chamber mounted to the transport vehicle an inside positioning signal (which, in some exemplary embodiments, differs from externally received GNSS signals at that location); while the transport vehicle is moving, transmitting to the device inside the mobile anechoic chamber mounted to the transport vehicle an interference signal (e.g., a jamming signal and/or a spoofing signal); and monitoring the device to determine its ability to utilize the inside positioning signals and the vehicle condition signal to resist the interference signal inside the mobile anechoic chamber mounted to the transport vehicle while the transport vehicle is moving.

An exemplary mobile anechoic chamber comprises: an anechoic enclosure shielded from external electromagnetic radiation and adapted to be transportable using a vehicle, the enclosure comprising: a first antenna located within the enclosure in communication with a first transmitter; a second antenna located within the enclosure and in communication with a second transmitter; a signal pass-through adapted to pass one or more communications media from outside of the enclosure to within the enclosure; and a vehicle condition sensor signal received from outside the enclosure and supplied within the enclosure. The device under test is monitored to determine its ability to utilize the inside positioning signals and the vehicle condition sensor signal to resist an interference signal inside the mobile anechoic chamber while the vehicle is moving.

In order to test or calibrate a GNSS receiver that is adapted to receive vehicle status and information, some means must be provided to isolate the GNSS receiver under test from actual GNSS signals received at that location. One such means is an RF anechoic chamber, which is known in the art. Additionally, transmitting many types of signals at GNSS frequencies above a certain threshold in an open environment without a license is a violation of FAA rules and regulations. Accordingly, some means must be provided to prevent such signals from escaping the chamber and radiating in the open environment. Again, one such means is an RF anechoic chamber, which is known in the art. Such chambers are designed to absorb reflected RF signals from sources inside the chamber and shield the chamber interior from RF signals that originate from outside of the RF chamber. By placing a GNSS receiver inside such a chamber, an operator can control the RF environment perceived by the GNSS receiver. Applicant has realized that a specially configured mobile anechoic chamber can be used to test new GNSS devices.

Figure 1:
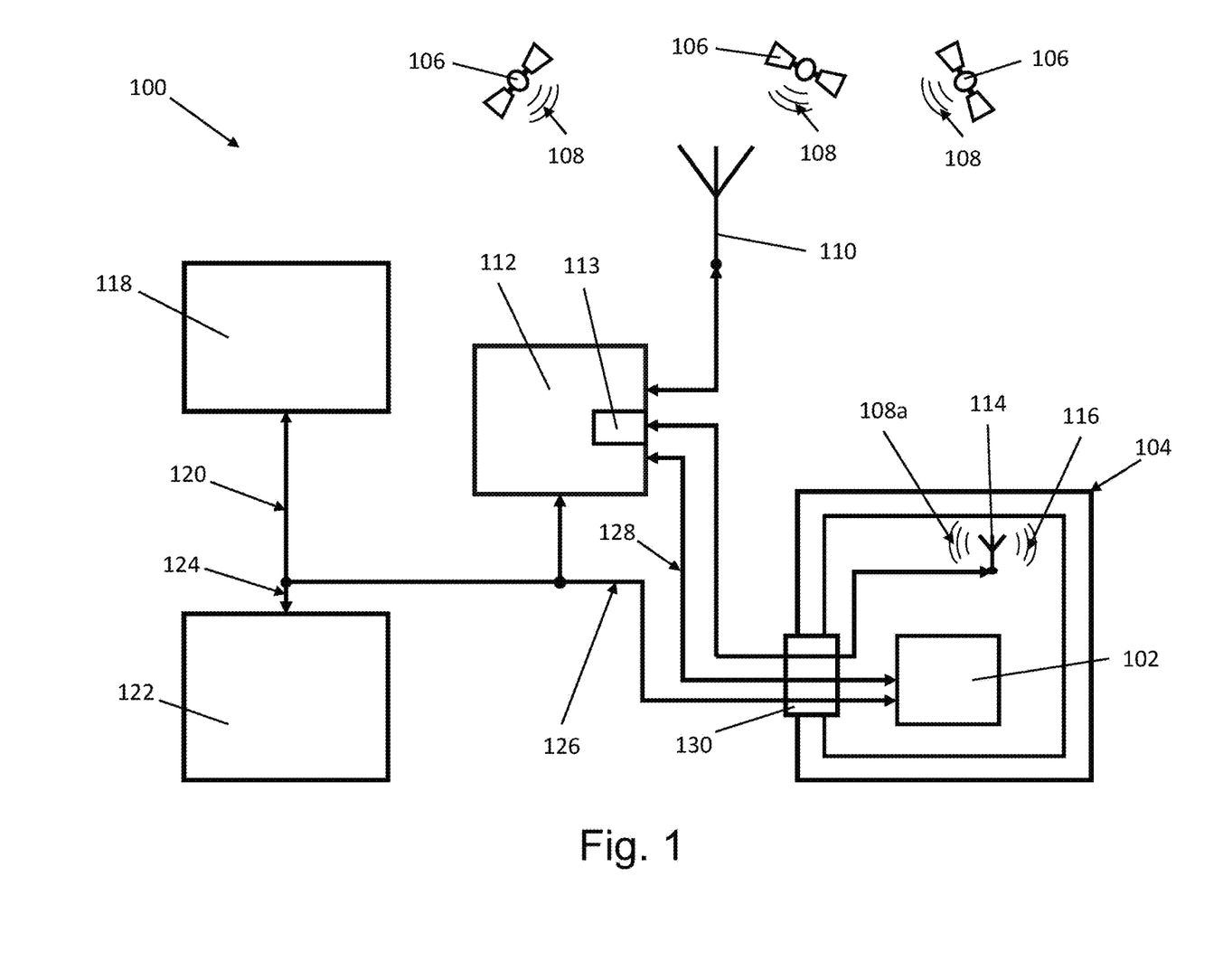
FIG. 1 is a schematic block diagram of the components of an exemplary embodiment of the invention in communication with a GNSS device.

A block diagram of an exemplary embodiment 100 is illustrated in FIG. 1. In such an exemplary embodiment, a GNSS receiver 102 under test is positioned inside a mobile anechoic chamber 104. GNSS signals, e.g., GPS satellite 106 signals 108 (e.g., positioning signals) are received by a receiving antenna 110 and provided to a controller 112. In some exemplary embodiments, the signals 108 are GNSS/GPS signals, Cellular signals, S-band signals, 5G signals, and/or other signals of opportunity (SOOP). The controller may retransmit the signals 108 using at least one transmitter 113 to a transmitting antenna 114 located inside the anechoic chamber 104 to transmit inside signals 108a (e.g., GNSS signals) inside the chamber 104. This configuration allows the controller 112 to control the strength of the inside GNSS signals 108a provided to the GNSS receiver 102. In the alternative, in some exemplary embodiments, the antenna 110 outside the chamber 104 is directly connected to the inside antenna 114 through wiring via a retransmission or repeater device (FIG. 6C), such as a GPS Repeater Kit commercially available from GPS Source, Inc. In some exemplary embodiments, one or more simulators generate the signals 108a that are transmitted inside the anechoic chamber 104 (rather than using received signals 108). Thus, in some exemplary embodiments, the inside signals 108a transmitted inside the chamber 104 are unrelated to the received signals 108 (e.g., signals representing a different location or altitude). In addition to (or instead of) the inside GNSS signals 108a, the controller 112 may also use the transmitter 113 to transmit jamming or spoofing signals 116 to the transmitting antenna 114 inside the anechoic chamber 104. In exemplary embodiments, vehicle sensors 118 provide vehicle sensor signals 120 and optionally other sensors 122 provide other sensor signals 124 which are combined into a source of sensor signals 126 provided to the GNSS receiver 102 (or simply received by the GNSS receiver 102).

In exemplary embodiments, the source of the at least one vehicle condition signal 120 is selected from the list of: a wheel rotation sensor, a speedometer, an inertial sensor, a compass, a barometer, an altimeter, an accelerometer, and other data provided by a vehicle onboard communication bus. In some exemplary embodiments, at least one vehicle condition signal 120 is provided from sensors located inside the vehicle transporting the device under test 102 (e.g., INS/DNS, etc.). As to the other signal sources 122, e.g., other external alt-nav sensors (e.g., Satellite Time and Frequency (STL) signals, or signals from other satellites that are currently or will in the future be able to provide measurements or data which allow for positioning and time), there is not a bright line between the vehicle sensors and the other external alt-nav sensors. Some vehicles will already have such sensors, making them vehicle sensors 118. Other vehicles will need to have the sensors added, making them other external alt-nav sensors 122, e.g., vision aiding sensors, celestial navigation sensors, and barometers/altimeters. While the illustrated embodiment shows that sensor signals 126 are provided to the device under test 102 as well as to the controller 112, other exemplary embodiments may provide the sensor signals 126 to the controller 112 whereupon the controller 112 may control the provision of the sensor signals 126 to the GNSS receiver 102. In such exemplary embodiments, the controller 112 is configured to monitor the sensor signals 126 (e.g., vehicle sensor signals 120 and/or other sensor signals 124) that are sent to the controller 112 by the vehicle sensors 118 and/or other sensors 122. As illustrated, the controller 112 is also in communication with the GNSS receiver 102 using a monitoring connection 128. This connection 128 allows the controller 112 to monitor and adjust the GNSS receiver 102 as needed to conduct testing.

Exemplary embodiments of the anechoic chamber 104 comprise an umbilical patch panel 130 (which may also be referred to as a pass-through) that is configured such that external signals and power can be supplied to the GNSS receiver 102 being tested in the anechoic chamber 104. In exemplary embodiments, the umbilical patch panel 130 may be configured with a plurality of connectors, which include, without limitation, serial control and data connections, power connections, and RF connections. Any number of connectors can be employed as needed to accommodate the GNSS receiver 102 as well as provide RF signals to the transmission antenna 114. In some exemplary embodiments, power that is supplied to the device under test 102 is generated by the vehicle transporting the anechoic chamber 104. In some exemplary embodiments, power that is supplied to the device under test 102 is generated by an independent power source relative to power that is generated by the vehicle transporting the anechoic chamber 104.

Figure 2:
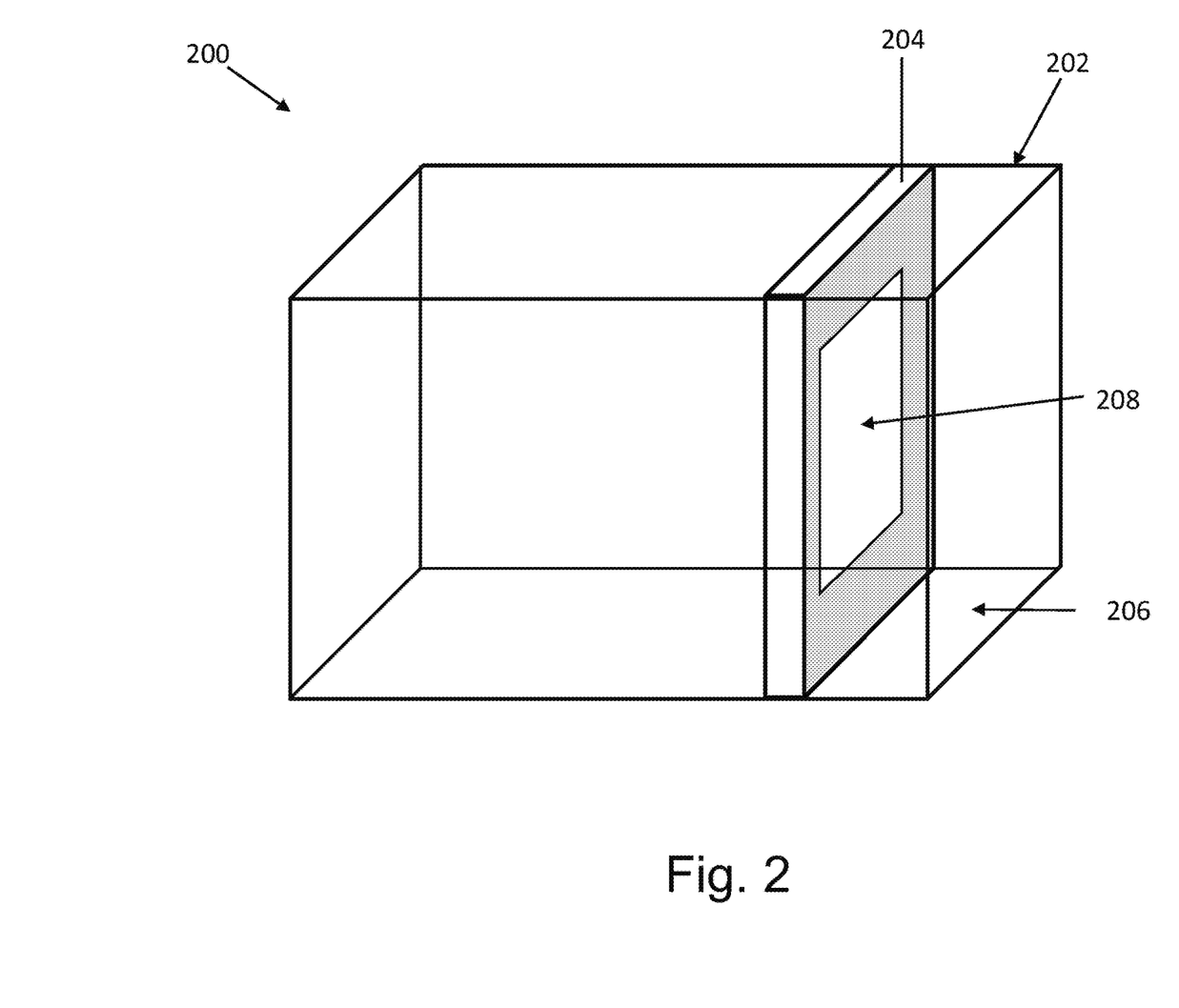
FIG. 2 is an illustration of a mobile anechoic chamber according an exemplary embodiment.

Known embodiments of anechoic chambers are large and costly and lack the dynamic movement that would be representative of real-world field deployment. Additionally, such chambers are not well suited for installation in a vehicle because of size and durability concerns. Referring now to FIG. 2, an exemplary embodiment of an anechoic chamber 200 is shown. In the exemplary embodiment of FIG. 2, a shipping container is used as an outer enclosure 202. Shipping containers are of necessity, durable enough for transport and because they are fabricated from metal, can provide at least some level of RF signal shielding. As illustrated in FIG. 2, an inner wall 204 is positioned inward from an opening 206 that is provided with hinged doors (not shown). Such doors are commonly provided with shipping containers 202 but because they are ill-fitting (at least with respect to RF signals), an inner wall 204 is used to provide a higher level of RF signal isolation. As illustrated, the inner wall 204 is provided with an access passage 208 that is sized to allow access to the inside of the anechoic chamber 200. The passage 208 is equipped with a tightly fitting door (not shown) to provide RF signal isolation greater than that which could be obtained with standard shipping container doors.

Figure 3:
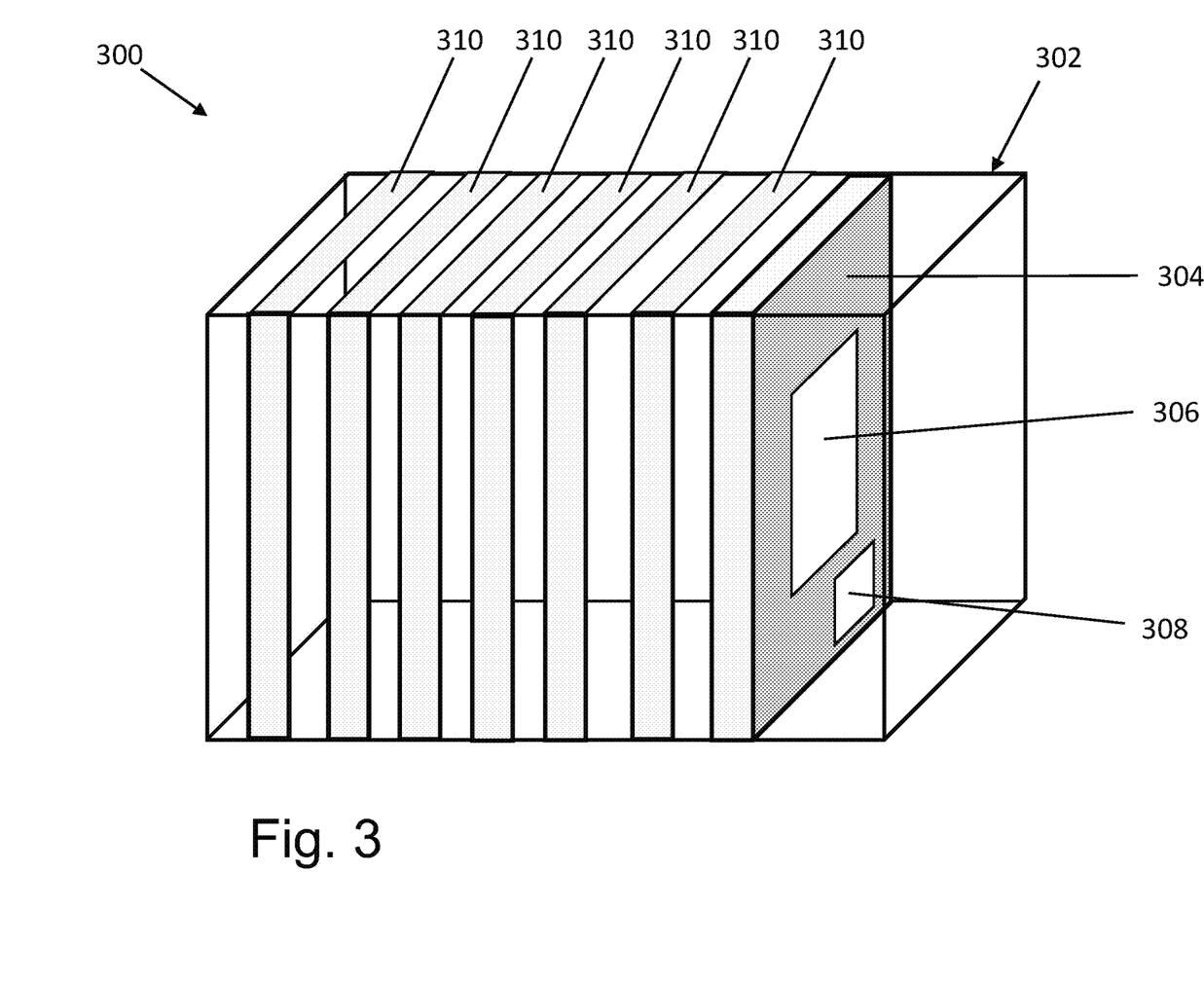
FIG. 3 is an illustration of a mobile anechoic chamber with spacing slats installed to mount an inner chamber according to an exemplary embodiment.

Another exemplary embodiment of an anechoic chamber 300 is provided in FIG. 3. As shown, the anechoic chamber 300 comprises an outer enclosure 302 formed from a shipping container, an inner wall 304, and an access passage 306 in a manner similar to the anechoic chamber 200 of FIG. 2. The inner wall 304 is illustrated with an umbilical patch panel 308 to permit signals and power to pass into and out of the enclosure formed by the anechoic chamber 300. Because shipping containers are not intended to function as anechoic chambers 300, an inner enclosure may be formed to function as a faraday cage. In the anechoic chamber 300 illustrated in FIG. 3, a series of strips 310 are positioned along the inner walls of the shipping container 302. These strips 310 serve to locate inner walls (not shown) that form a faraday cage inside the shipping container 302. In order to function properly, these strips 310 should provide electrical isolation between the faraday cage and the walls of the shipping container 302. In exemplary embodiments, consideration should be given to the environmental conditions that the anechoic chamber 300 may be subject to. Thus, materials that may be damaged by moisture such as wood, or overly fragile materials such as many types of glass or ceramic should be avoided.

Figure 4:
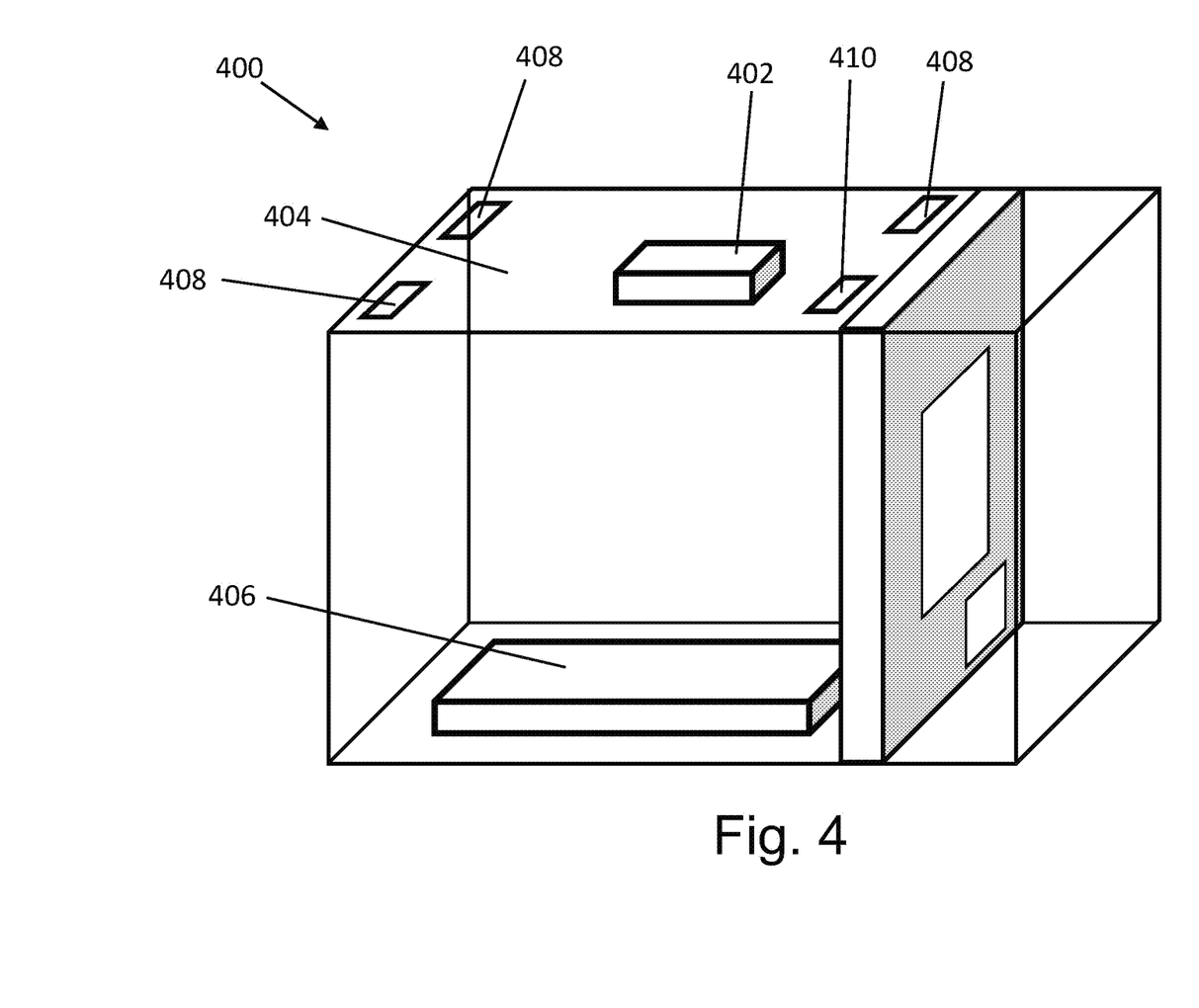
FIG. 4 is an illustration of a mobile anechoic chamber further comprising antennas and isolating layers.

As was illustrated in FIG. 1, a transmitting antenna 114 is positioned inside an exemplary embodiment of an anechoic chamber 104. FIG. 4 illustrates an exemplary embodiment of an anechoic chamber 400. As illustrated, the transmission antenna 402 (e.g., 114 of FIG. 1) is positioned at the top wall 404 of the chamber 400. In some exemplary embodiments, the transmission antenna 402 is in communication with a first transmitter (113 in FIG. 1). In such exemplary embodiments, the transmission antenna 402 is configured to transmit signals 108a (received from the first transmitter) inside the chamber 400. Also illustrated is a pedestal 406 upon which a GNSS system (not shown) under test can be located. The pedestal 406 may be configured such that the GNSS system can be affixed in place to avoid physical damage during movements imparted on the anechoic chamber 400 by the vehicle that the anechoic chamber is mounted within. In addition to securing the GNSS system under test, the pedestal 406 should be durable enough that a person installing the GNSS system under test can walk or otherwise move about on the pedestal 406 without damaging the pedestal. In exemplary embodiments, one or more jamming antennas 408 and/or one or more spoofing antennas 410 are located inside the chamber 400 and are configured to transmit jamming signals and/or spoofing signals (known to those skilled in the art) during testing of the device while the vehicle is in motion, as described herein. In some exemplary embodiments, the jamming antennas 408 and/or spoofing antennas 410 are in communication with a second transmitter (e.g., part of transmitter 113 in controller 112). In such exemplary embodiments, the jamming and/or spoofing antennas 408 and 410 are configured to transmit the jamming and/or spoofing signals (received from the second transmitter) inside the chamber 400.

Figure 5:
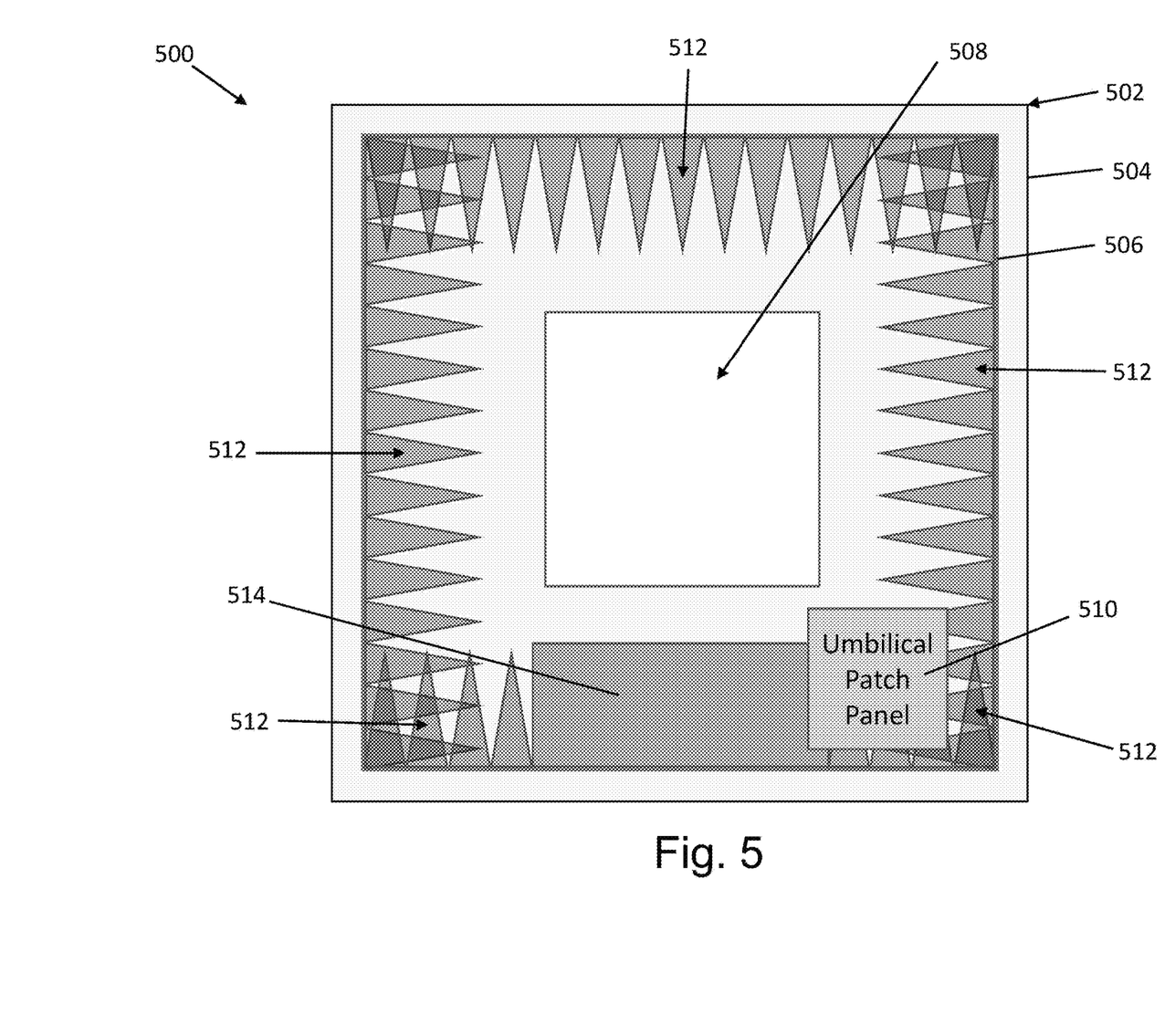
FIG. 5 is a cross-sectional illustration of a mobile anechoic chamber which illustrates absorptive material according to an exemplary embodiment.

FIG. 5 illustrates a sectional schematic view 500 of an anechoic chamber 502. Illustrated is the shipping container 504 that forms the outer portion of the anechoic chamber 502. Also illustrated is an inner chamber 506 that forms a faraday cage to further isolate the GNSS system under test (not shown) from RF signals present outside the anechoic chamber 502. The access passage 508 is illustrated such that it provides user access to the inner portions of the anechoic chamber 502. The umbilical patch panel 510 is also visible. To further enhance the ability of the anechoic chamber 502 to isolate GNSS systems placed in the inner chamber 506, signal absorption structures 512 are located within the inner chamber 506. These structures 512 serve to absorb RF signals that may be produced by electrical equipment located inside the inner chamber 506 or RF signals that may pass through imperfections in the faraday cage formed by the inner chamber 506. Also visible is a pedestal 514 located inside the anechoic chamber 502 that is adapted to secure a GNSS receiver during transport of the anechoic chamber 502.

As noted above with regard to FIG. 1, in certain exemplary embodiments, an anechoic chamber 104 has provisions for providing vehicle sensor data to a GNSS receiver 102 under test. In order to provide the most realistic simulation of vehicle sensors, any of the mobile anechoic chambers fabricated from a shipping container can be transported using a suitable vehicle, e.g., a suitably sized wheeled or treaded vehicle (such as a flatbed truck, pickup truck, or tank), an airplane, or a ship, and used to test GNSS receivers and other GNSS equipment using vehicle sensor signals from that vehicle while that vehicle is moving.

Figure 6A:
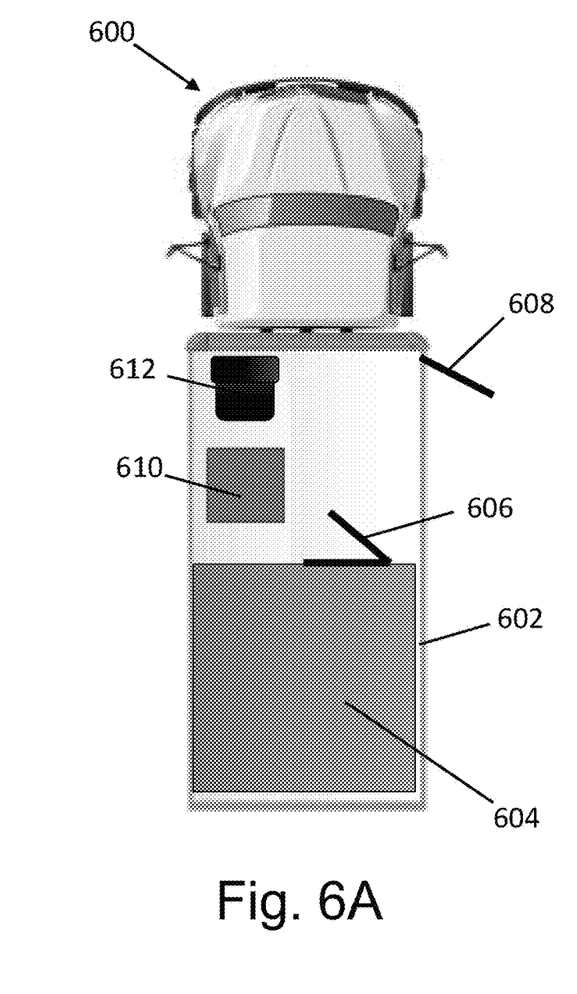
FIGS. 6A and 6B are schematic illustrations of a mobile anechoic chamber mounted in the cargo area of a truck according to an exemplary embodiment.
Figure 6B:
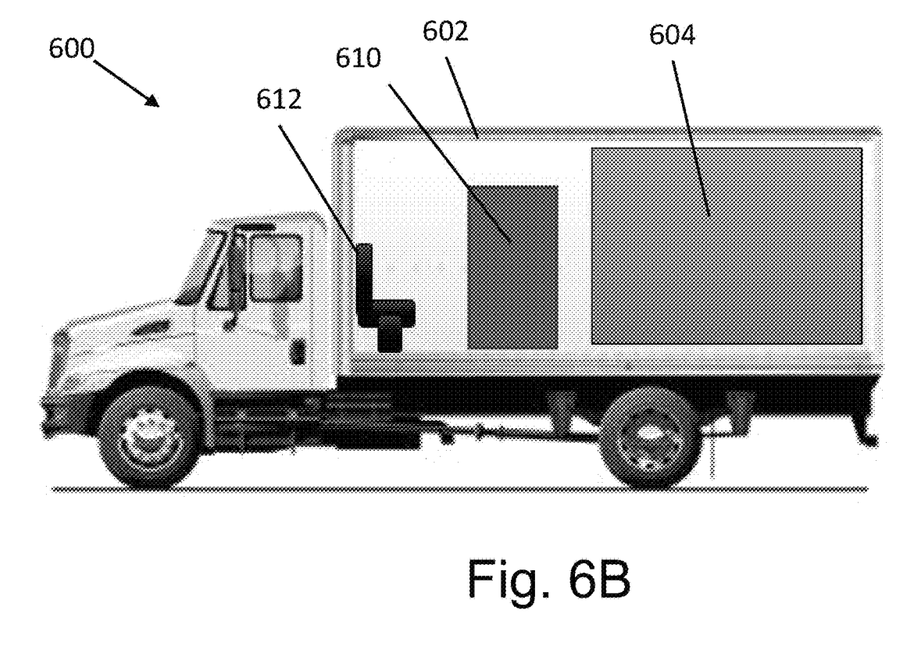

In the alternative, in exemplary embodiments, a mobile anechoic chamber is fabricated inside a vehicle and tested using vehicle signals while the vehicle is moving. Referring now to FIGS. 6A and 6B, an exemplary an anechoic chamber 604 built inside a truck is shown. The truck 600 shown in these figures is commonly referred to as a "box truck" because of the rectangular cargo enclosure 602 located on the rear of the truck. This rectangular enclosure serves as an excellent location to fabricate or install an anechoic chamber 604. As illustrated, an access passage or door 606 is located in a wall of the anechoic chamber 604 which is located within the rectangular enclosure 602. As shown, an operator access door 608 is located in a wall of the rectangular enclosure 602 to allow an operator to access the anechoic chamber 604. A control panel 610 is positioned in an operating area external to the anechoic chamber 602. This allows an operator to control testing being performed using the anechoic chamber 602 while the truck 600 is in motion. Vehicle signals from the truck 600 and perhaps other signals are passed into the chamber 604 for testing. In order to provide a safe operating environment for the operator, seating 612 is located adjacent to the control panel 610. During testing, the truck 600 will travel about, providing vehicle sensor data to the GNSS receiver 102 under test from actual vehicle sensors. In this configuration, inside GNSS signals will be transmitted inside the chamber 604, spoofing and/or jamming signals will be transmitted inside the chamber 604, and the device under test will be monitored to determine its ability to utilize the inside GNSS signals and the vehicle sensor data to resist the interference signal inside the mobile anechoic chamber while the truck 600 is driving around. One suitable truck for this type of embodiment is a 2019 Chevy Express 3500.

Figure 6C:
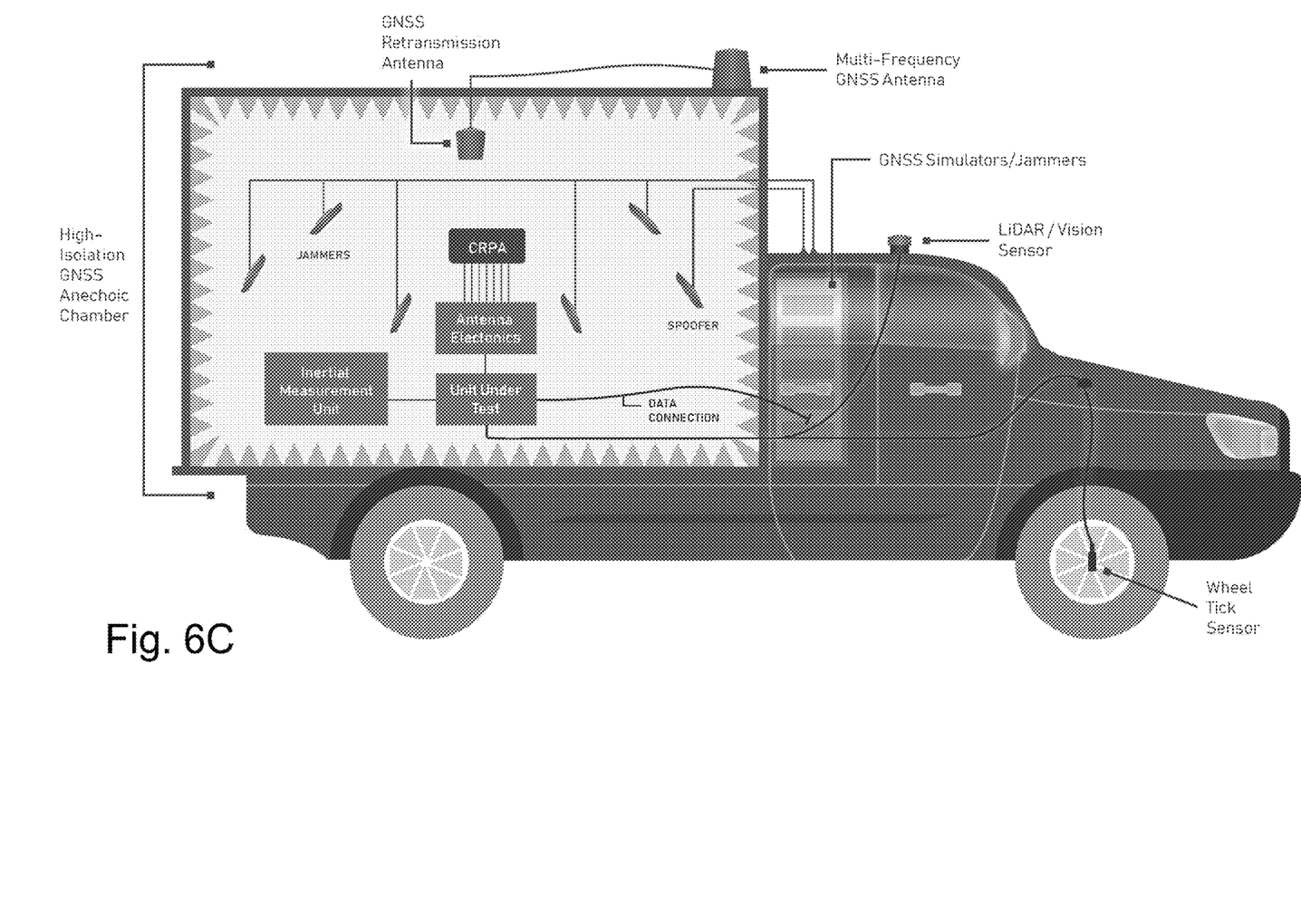
FIG. 6C is a schematic illustration of another mobile anechoic chamber mounted in the cargo area of a truck according to another exemplary embodiment.

Referring now to FIG. 6C, another exemplary embodiment of a truck-based system is shown. In this exemplary embodiment, a high-isolation GNSS anechoic chamber is built inside a truck cargo enclosure. An external Multi-Frequency GNSS Antenna passes externally received GNSS signals to a GNSS Retransmission Antenna using wiring via a retransmission or repeater device, such as a GPS Repeater Kit commercially available from GPS Source, Inc. In this exemplary embodiment, the Device Under Test inside the anechoic chamber has associated Antenna Electronics and a Controlled Reception Pattern Antenna (CRPA) and is connected to (a) an Inertial Measurement Unit (IMU), which can be inside or outside the anechoic chamber, (b) a LiDAR/Vision Sensor, (c) a wheel tick sensor, and (d) the control unit via a data connection. GNSS Simulators/Jammers generate spoofing and/or jamming signals, which are transmitted inside the anechoic chamber via corresponding spoofing antennas and/or jamming antennas. In this particular embodiment, the control unit and GNSS Simulators/Jammers are accessed via the truck passenger door behind the B-pillar.

Figure 7A:
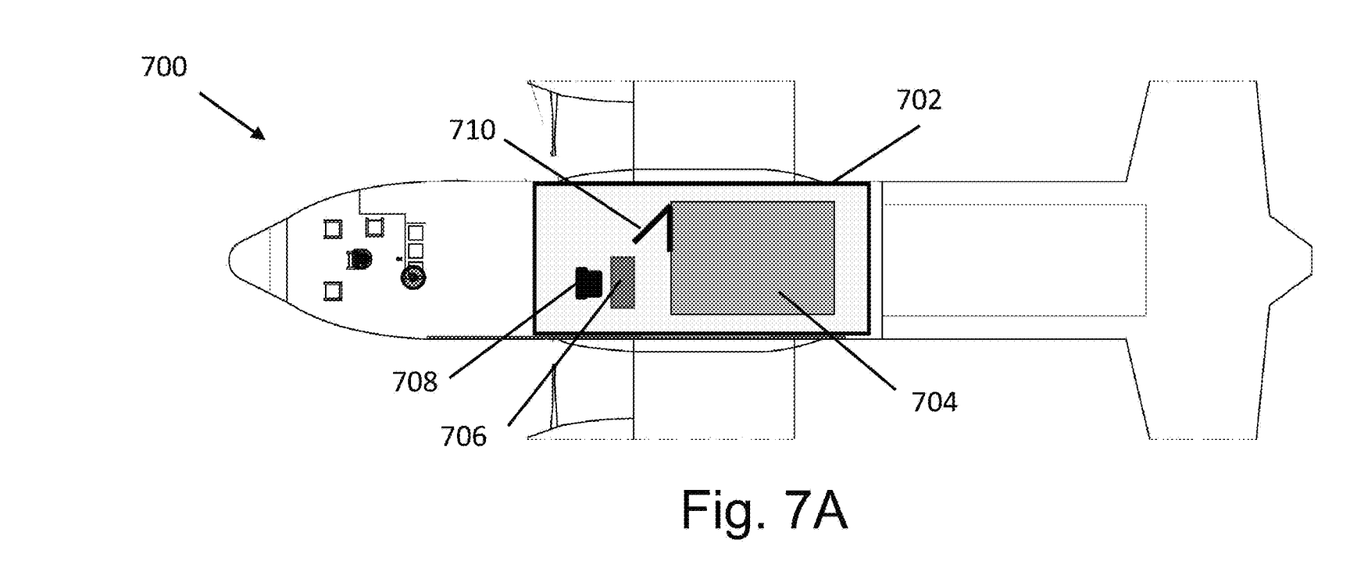
FIGS. 7A and 7B are schematic illustrations of a mobile anechoic chamber mounted in the cargo area of an aircraft according to an exemplary embodiment.
Figure 7B:
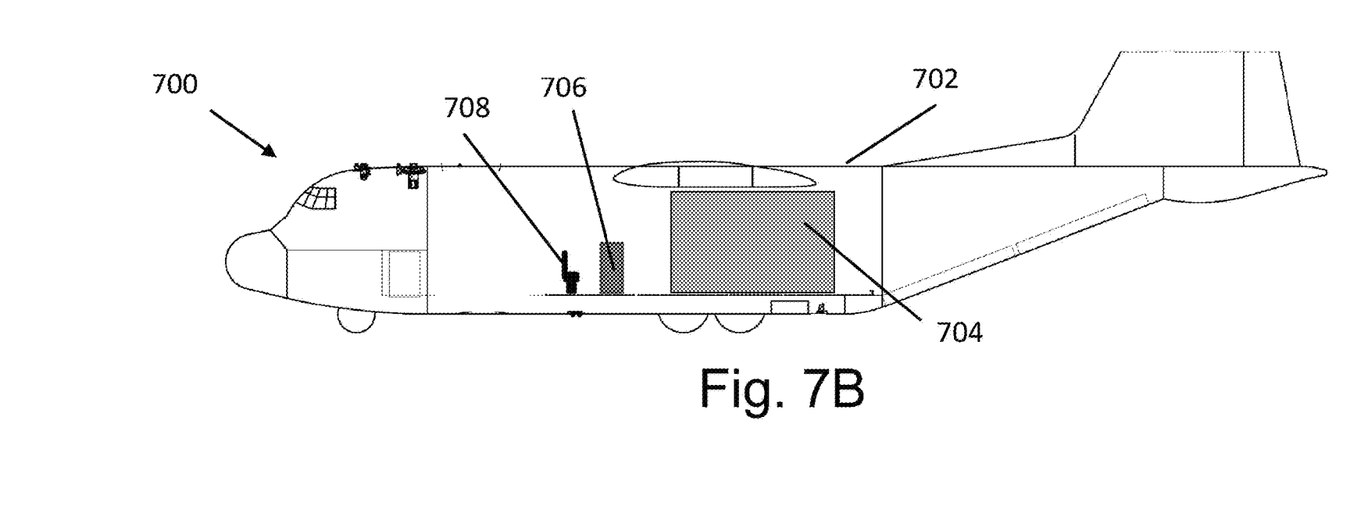

Similar arrangements can be positioned in the cargo hold of a ship or within the fuselage of an airplane depending upon the type of vehicle sensors that are being used to provide signals to the GNSS receiver 102 under test. FIGS. 7A and 7B illustrate another exemplary embodiment in which a mobile anechoic chamber 704 (e.g., a shipping container-based anechoic chamber) is mounted in an aircraft 700. As shown, the aircraft fuselage 702 comprises a cargo hold in which an anechoic chamber 704 is mounted. As with the exemplary embodiments illustrated in FIGS. 6A and 6B, this exemplary embodiment also comprises a control panel 706, seating 708 for an operator and an access door 710 that is positioned to allow an operator to access a device under test in the anechoic chamber 704. Vehicle signals from the plane 700 and perhaps other signals are passed into the chamber 704 for testing. In order to provide a safe operating environment for the operator, the seating 708 is located adjacent to the control panel 706. During testing, the plane 700 will fly around, providing vehicle sensor data to the GNSS receiver 102 under test from actual vehicle sensors. In this configuration, inside GNSS signals will be transmitted inside the chamber 704, spoofing and/or jamming signals will be transmitted inside the chamber 704, and the device under test will be monitored to determine its ability to utilize the inside GNSS signals and the vehicle sensor data to resist the interference signal inside the mobile anechoic chamber while the airplane 700 is flying around.

The illustrated embodiments of FIGS. 6A, 6B, 7A, and 7B are exemplary and one of ordinary skill in the art will realize that other types of vehicles, including, but not limited to other types of trucks, automobiles, construction equipment, UAVs, other types of aircraft, boats, and railway trains may be used to house anechoic chambers in other exemplary embodiments.

Figure 8A:
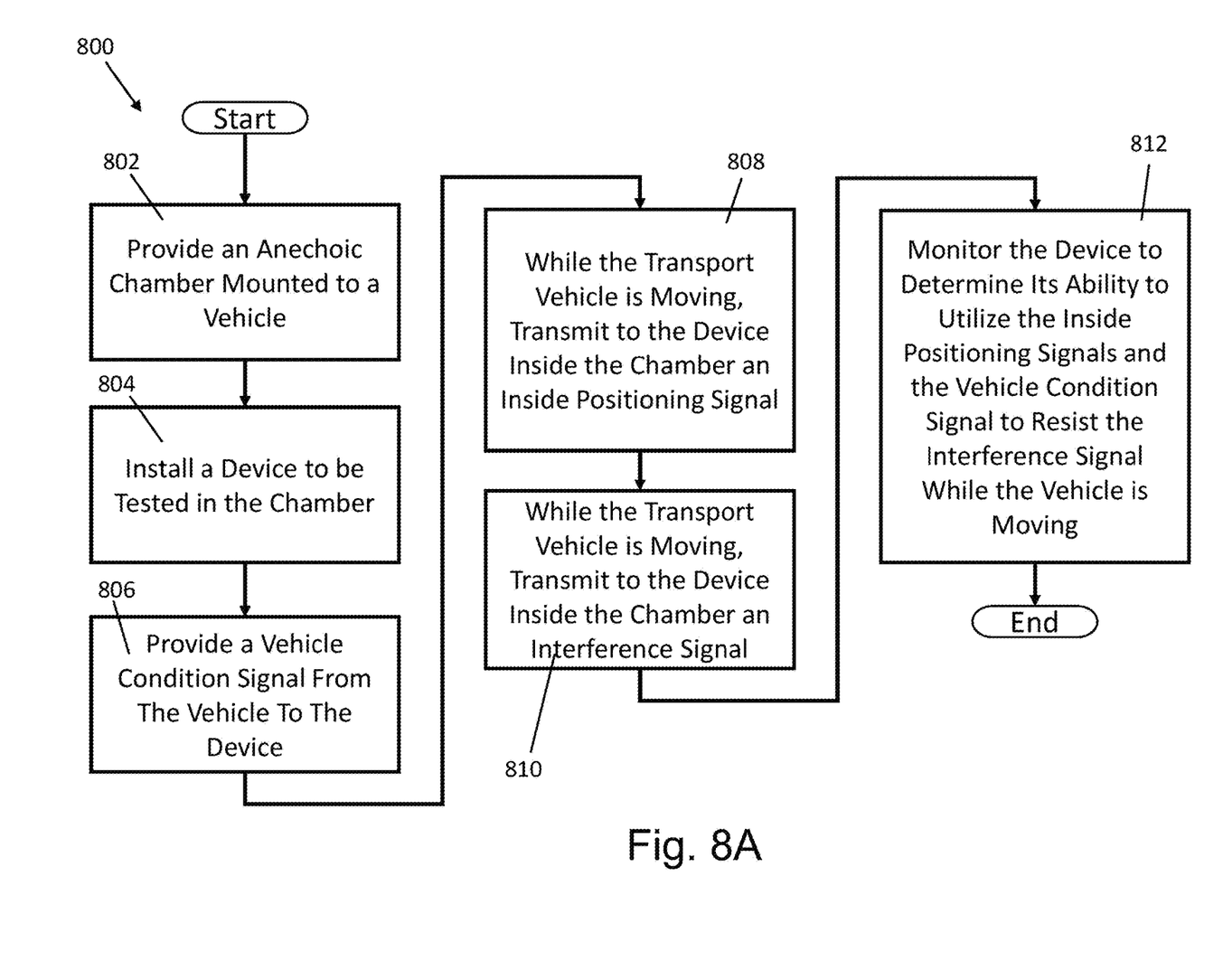
FIGS. 8A and 8B are flow charts illustrating the steps of testing devices according to exemplary embodiments of the invention.

In an exemplary embodiment, an anechoic chamber 104 is used to determine a device's ability to resist jamming and spoofing signals when mounted in a moving vehicle that provides vehicle condition signals resulting from the vehicle movement to the device. The flowchart of FIG. 8A illustrates the steps 800 involved in such a test. In step 802, and in an exemplary embodiment, an anechoic chamber 104 is provided to conduct the test. In step 804, a device to be tested is installed in the anechoic chamber 104. Vehicle condition signals are provided to the device under test in step 806. While the vehicle is moving, a positioning signal is provided inside the chamber to the device under test in step 808. In step 810, an interference signal is transmitted to the device from a source inside the anechoic chamber 104 and in step 812 the device under test is monitored to determine if the device has the ability to resist the interference signals.

Figure 8B:
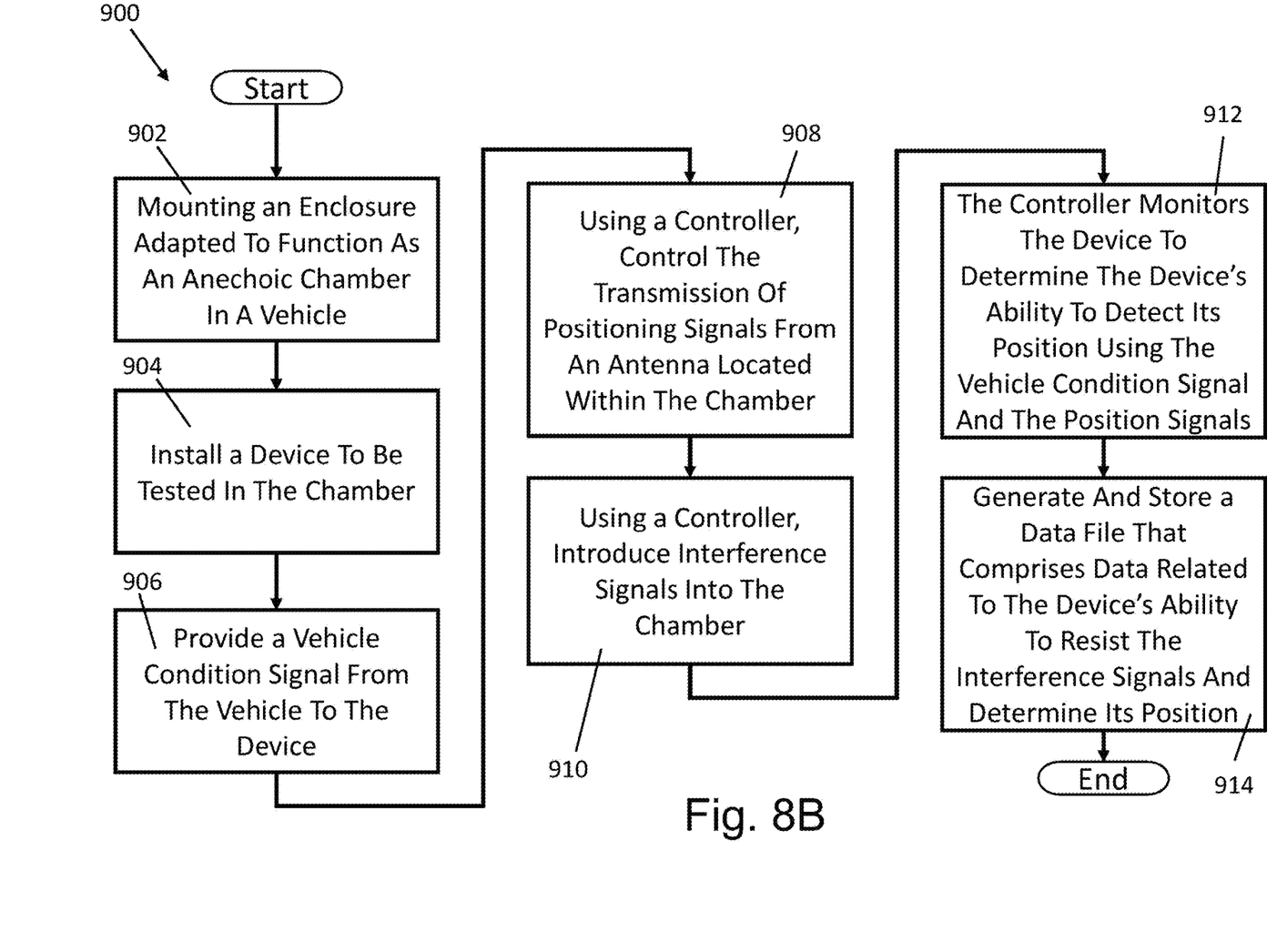

In another exemplary embodiment, an anechoic chamber 104 is used to test a device's ability to resist jamming and spoofing signals. The flowchart of FIG. 8B illustrates exemplary steps 900 involved in testing a device. In an exemplary embodiment, the device could be a GNSS receiver 112. In step 902, a chamber that is adapted to function as an anechoic chamber is mounted in a vehicle or is otherwise provided. A device to be tested is then installed in the chamber in step 904. One or more vehicle condition signals are supplied to the device under test in step 906. These vehicle condition signals may be the result of vehicle movement in certain exemplary embodiments. A controller is used to regulate the transmission of positioning signals in step 908. As described elsewhere herein, the position signals may be received by a receiver located outside of the chamber and then retransmitted from an antenna located within the chamber. In step 910, the controller causes interference signals (e.g., spoofing and/or jamming signals) to be introduced into the chamber. In such exemplary embodiments, the device receives the position signals and vehicle condition signals and attempts to determine its location in spite of the interference signals introduced into the chamber. In step 912, the controller monitors the device to determine its ability to detect its location accurately. For example, the controller may collect data from the device that represents the velocity or altitude reported by the device. These reported locations can be compared to the locations represented by the position signals received outside the chamber. In step 914, the results of these comparisons are stored in a data file that may then be used for such purposes as characterizing the ability of the device to determine its location in spite of interference signals that may be applied to the device.

In some exemplary embodiments, the system simulates jammers and spoofers (or other types of RF interference transmitters) located along the path of the vehicle, e.g., jammers and/or spoofers located along a road. In any of the foregoing embodiments, and in exemplary configurations, a control unit (e.g., controller 112) monitors the physical location of the vehicle and triggers the transmission of one or more interference signals (e.g., spoofing and/or jamming signals) based on the physical location of the vehicle transporting the anechoic chamber and device under test. For example, when the control unit determines that the vehicle has reached a first waypoint, the control unit begins transmitting a first interference signal (e.g., a jamming signal) inside the anechoic chamber, and when the control unit determines that the vehicle has reached a second waypoint, the control unit ceases transmitting the first interference signal and begins transmitting a second, different interference signal (e.g., a spoofing signal) inside the anechoic chamber. In some exemplary embodiments, the control unit monitors the device to determine its ability to utilize the inside positioning signals and the vehicle condition signal to resist the first and second interference signals inside the mobile anechoic chamber while the transport vehicle is moving.

All of the various anechoic chambers described herein will have RF absorbing material covering portions of or substantially all of the inside of the enclosure of the anechoic chamber. This RF absorbing material (a) isolates the device under test from external GNSS signals and (b) prevents jamming and spoofing signals transmitted inside the anechoic chamber from exiting the anechoic chamber. In exemplary embodiments, the RF absorbing material has an attenuation rating of at least 100 dB from 1 MHz to 40 GHz. In exemplary embodiments, the RF absorbing material comprises the following, which are commercially available from AP Americas: pan-type shielding, hot galvanized steel panels, thickness 2 mm, mesh for RF tightness, distance between holes 7.5 cm, RF flange depth 5 cm, modular, module dimensions are multiples of 30 cm, unique double-wing doors with >100 dB attenuation at 40 GHz.

While the present invention and associated inventive concepts have been illustrated by the description of various embodiments thereof, and while these embodiments have been described in considerable detail, it is not the intention of the Applicant to restrict or in any way limit the scope of the appended claims to such detail. Additional advantages and modifications will readily appear to those skilled in the art. For example, although the embodiments described herein relate to GNSS signals, the teachings herein apply equally to Alt-Nav signals, with Alt-Nav signals being used instead of GNSS signals. Moreover, in some instances, elements described with one embodiment may be readily adapted for use with other embodiments. Therefore, the invention, in its broader aspects, is not limited to the specific details, the representative apparatus, and illustrative examples shown and described. Accordingly, departures may be made from such details without departing from the spirit or scope of the general inventive concepts.

EXEMPLARY EMBODIMENTS

The following is a non-exhaustive list of exemplary embodiments according to aspects of the present disclosure.

1. A mobile anechoic chamber comprising:
an anechoic enclosure shielded from external electromagnetic radiation and adapted to be transportable using a vehicle, the enclosure comprising:
a first antenna located within the enclosure in communication with a first transmitter;
a second antenna located within the enclosure and in communication with a second transmitter;
a signal pass-through adapted to pass one or more communications media from outside of the enclosure to within the enclosure;
a vehicle condition sensor signal received from outside the enclosure and supplied within the enclosure;
a control computer which is adapted to:
 a. receive a first signal from a source of positioning signals;
 b. provide to the first transmitter an inside positioning signal corresponding to the first signal for transmission into the chamber via the first antenna;
 c. receive a second signal from the vehicle condition sensor signal; and
 d. provide a third signal to the second transmitter that interferes with the inside positioning signal for transmission into the chamber via the second antenna.

2. The mobile anechoic chamber of embodiment 1, wherein the source of positioning signals is selected from one of:
(a) a Global Navigation Satellite Systems (GNSS) system comprising:
 a receiving antenna located externally to the enclosure; and
 a receiver in electronic communication with the receiving antenna; or
(b) a global positioning signal simulator.

3. The mobile anechoic chamber of embodiment 1 or embodiment 2, wherein the source of global positioning signals supplies signals selected from GNSS/GPS, Cellular, S-band, and 5G.

4. The mobile anechoic chamber of any one of embodiments 1-3, wherein the signal pass-through is further adapted to electronically interface with a device under test.

5. The mobile anechoic chamber of any one of embodiments 1-4, wherein the third signals are selected from jamming signals and spoofing signals.

6. The mobile anechoic chamber of any one of embodiments 1-5, wherein the source of the vehicle condition sensor signal is selected from the group comprising: a wheel rotation sensor, a speedometer, a barometer, an altimeter, an inertial sensor, a compass, an accelerometer, and other data provided by a vehicle onboard communication bus.

7. The mobile anechoic chamber of any one of embodiments 1-6, wherein the control computer executes instructions to:
transmit the first signal to a device under test in the chamber via the first antenna;
monitor the second signal;
transmit the third signal to the device under test in the chamber via the second antenna;
monitor the device under test to determine the effect of the third signal on the device under test; and
generate a data file that comprises the determined effect of the third signal on the device under test.

8. The mobile anechoic chamber of embodiment 7, wherein the effect of the third signal is to cause the device under test to inaccurately determine its location from the first signal.

9. The mobile anechoic chamber of any one of embodiments 1-8, wherein the anechoic enclosure comprises an inner chamber that functions as a faraday shield.

10. The mobile anechoic chamber of any one of embodiments 1-9, further comprising a power source for powering the device under test that operates independently from a power source supplied from the vehicle.

11. A system for testing the resistance of a device under test to interference, the system comprising:
an enclosure shielded from external electromagnetic radiation and adapted to function as an anechoic chamber while being transported;
a source of global positioning signals with a first transmission antenna located within the enclosure;
a source of interference signals with a second transmission antenna located in the interior of the enclosure;
at least one vehicle condition signal provided to the interior of the enclosure; and
a controller that controls the source of global positioning signals and the source of interference signals, the controller further monitoring the device under test to determine the ability of the device under test to utilize the global positioning signals and the at least one vehicle condition signal to resist the interference signals.

12. The system of embodiment 11, wherein the source of global positioning signals is selected from one of:
(a) a global positioning signal system comprising:
 a receiving antenna located externally to the enclosure; and
 a receiver in electronic communication with the receiving antenna; or
(b) a global positioning signal simulator.

13. The system of embodiment 11 or embodiment 12, wherein the source of global positioning signals supplies signals selected from GNSS/GNSS, Cellular, S-band, and 5G.

14. The system of any one of embodiments 11-13, wherein the source of interference signals is selected from jamming signals and spoofing signals.

15. The system of any one of any one of embodiments 11-14, wherein the at least one vehicle condition signal is provided by a vehicle transporting the system.

16. The system of embodiment 15, wherein a source of the at least one vehicle condition signal is selected from the group comprising: a wheel rotation sensor, a speedometer, an inertial sensor, a compass, a barometer, an altimeter, an accelerometer, and other data provided by a vehicle onboard communication bus.

17. The system of any one of embodiments 11-16, wherein the controller performs the steps of:
   transmitting a first signal to a device under test;
   transmitting a second signal to the device under test;
   transmitting a third signal to the device under test;
   monitoring the device under test to determine the effect of the third signal on the device under test; and
generating a data file that comprises the determined effect of the third signal on the device under test.

18. The system of any one of embodiments 11-17, wherein the enclosure comprises a rigid outer shell and an inner chamber that functions as a faraday shield.

19. The system of any one of embodiments 11-18, further comprising a power source for powering the device under test that operates independently of a power source supplied from a vehicle transporting the system.

20. A method of testing the resistance of a device to radiofrequency (RF) interference comprising:
   providing a mobile anechoic chamber shielded from external electromagnetic radiation and mounted to a transport vehicle;
   installing a device to be tested in the mobile anechoic chamber mounted to the transport vehicle;
   providing a vehicle condition signal from the vehicle to the device;
   while the transport vehicle is moving, transmitting to the device inside the mobile anechoic chamber mounted to the transport vehicle an inside positioning signal;
   while the transport vehicle is moving, transmitting to the device inside the mobile anechoic chamber mounted to the transport vehicle an interference signal; and
   monitoring the device to determine its ability to utilize the inside positioning signals and the vehicle condition signal to resist the interference signal inside the mobile anechoic chamber mounted to the transport vehicle while the transport vehicle is moving.

21. A method of testing the resistance of a device to radiofrequency (RF) interference comprising:
   mounting an anechoic chamber shielded from external electromagnetic radiation in a transport vehicle;
   positioning the device inside the anechoic chamber;
   providing to the device inside the anechoic chamber at least one vehicle condition signal originating from the transport vehicle;
   while the transport vehicle is moving, transmitting to the device inside the anechoic chamber an inside positioning signal corresponding to an external positioning signal received outside the anechoic chamber;
   while the transport vehicle is moving, transmitting to the device inside the anechoic chamber an RF interference signal; and
   monitoring the device to determine the device's ability to utilize the positioning signals and the at least one vehicle condition signal to resist the RF interference signal while the transport vehicle is moving; and
   generating and storing a data file corresponding to the device's ability to utilize the positioning signals and the at least one vehicle condition signal to resist the RF interference signal while the transport vehicle is moving.

22. A method of testing the resistance of a device to radiofrequency (RF) interference comprising:
   mounting an enclosure shielded from external electromagnetic radiation and adapted to function as an anechoic chamber in a transport vehicle, the enclosure comprising:
   a source of positioning signals with a first transmission antenna located within the enclosure;
   a source of interference signals with a second transmission antenna located in the interior of the enclosure;
   at least one vehicle condition signal originating from the transport vehicle provided to the device; and
   a controller in communication with the subject positioning device, the source of positioning signals, and the source of interference signals;
   using the controller, controlling the source of positioning signals and the source of interference signals to cause the positioning signals and the source of interference signals to be transmitted to the device;
   using the controller, monitoring the device to determine the device's ability to utilize the positioning signals and the at least one vehicle condition signal to resist the interference signals; and
   using the controller, generating a data file that comprises the determined device's ability to utilize the positioning signals and the at least one vehicle condition signal to resist the interference signals.

23. The mobile anechoic chamber or system or method of any one of embodiments 1-22, wherein RF absorbing material covers substantially all of the inside of the enclosure or anechoic chamber.

24. The mobile anechoic chamber or system or method of any one of embodiments 1-23, wherein the positioning signals are GNSS signals.

25. The mobile anechoic chamber or system or method of any one of embodiments 1-24, wherein the positioning signals are GPS signals.

What is claimed is:
1. A mobile anechoic chamber comprising:
   an anechoic enclosure shielded from external electromagnetic radiation and adapted to be transportable using a vehicle, the enclosure comprising:
      a first antenna located within the enclosure in communication with a first transmitter;
      a second antenna located within the enclosure and in communication with a second transmitter;
      a signal pass-through adapted to pass one or more communications media from outside of the enclosure to within the enclosure;
   a vehicle condition sensor signal received from outside the enclosure and supplied within the enclosure;
   a control computer which is adapted to:
      receive a first signal from a source of positioning signals;
      provide to the first transmitter an inside positioning signal corresponding to the first signal for transmission into the chamber via the first antenna;
      receive a second signal from the vehicle condition sensor signal; and
      provide a third signal to the second transmitter that interferes with the inside positioning signal for transmission into the chamber via the second antenna.

2. The mobile anechoic chamber of claim 1, wherein the source of positioning signals is selected from one of:
   a) a Global Navigation Satellite Systems (GNSS) system comprising:
      a receiving antenna located externally to the enclosure; and a receiver in electronic communication with the receiving antenna; or b) a global positioning signal simulator.

3. The mobile anechoic chamber of claim 1, wherein the signal pass-through is further adapted to electronically interface with a device under test.

4. The mobile anechoic chamber of claim 1, wherein the third signals are selected from jamming signals and spoofing signals.

5. The mobile anechoic chamber of claim 1, wherein the source of the vehicle condition sensor signal is selected from the group comprising: a wheel rotation sensor, a speedometer, a barometer, an altimeter, an inertial sensor, a compass, an accelerometer, and other data provided by a vehicle onboard communication bus.

6. The mobile anechoic chamber of claim 1, wherein the control computer executes instructions to:
transmit the first signal to a device under test in the chamber via the first antenna;
monitor the second signal;
transmit the third signal to the device under test in the chamber via the second antenna;
monitor the device under test to determine the effect of the third signal on the device under test; and
generate a data file that comprises the determined effect of the third signal on the device under test.

7. The mobile anechoic chamber of claim 6, wherein the effect of the third signal is to cause the device under test to inaccurately determine its location from the first signal.

8. The mobile anechoic chamber of claim 1, wherein the anechoic enclosure comprises an inner chamber that functions as a faraday shield.

9. The mobile anechoic chamber of claim 1, further comprising a power source for powering the device under test that operates independently from a power source supplied from the vehicle.

10. The mobile anechoic chamber of claim 1, wherein RF absorbing material covers substantially all of the inside of the enclosure or the anechoic chamber.

11. The mobile anechoic chamber of claim 1, wherein the positioning signals are GNSS signals.

12. The mobile anechoic chamber of claim 1, wherein the positioning signals are GPS signals.

13. A system for testing the resistance of a device under test to interference, the system comprising:
an enclosure shielded from external electromagnetic radiation and adapted to function as an anechoic chamber while being transported;
a source of global positioning signals with a first transmission antenna located within the enclosure;
a source of interference signals with a second transmission antenna located in the interior of the enclosure;
at least one vehicle condition signal provided to the interior of the enclosure; and
a controller that controls the source of global positioning signals and the source of interference signals, the controller further monitoring the device under test to determine the ability of the device under test to utilize the global positioning signals and the at least one vehicle condition signal to resist the interference signals.

14. The system of claim 13, wherein the source of global positioning signals is selected from one of:
a) a global positioning system comprising:
a receiving antenna located externally to the enclosure; and
a receiver in electronic communication with the receiving antenna; or
b) a global positioning signal simulator.

15. The system of claim 13, wherein the source of interference signals is selected from jamming signals and spoofing signals.

16. The system of claim 13, wherein the at least one vehicle condition signal is provided by a vehicle transporting the system.

17. The system of claim 16, wherein a source of the at least one vehicle condition signal is selected from the group comprising: a wheel rotation sensor, a speedometer, an inertial sensor, a compass, a barometer, an altimeter, an accelerometer, and other data provided by a vehicle onboard communication bus.

18. The system of claim 13, wherein the controller performs the steps of:
transmitting a first signal to a device under test;
transmitting a second signal to the device under test;
transmitting a third signal to the device under test;
monitoring the device under test to determine the effect of the third signal on the device under test; and
generating a data file that comprises the determined effect of the third signal on the device under test.

19. The system of claim 13, wherein the enclosure comprises a rigid outer shell and an inner chamber that functions as a faraday shield.

20. A method of testing the resistance of a device to radiofrequency (RF) interference comprising:
providing a mobile anechoic chamber shielded from external electromagnetic radiation and mounted to a transport vehicle;
installing a device to be tested in the mobile anechoic chamber mounted to the transport vehicle;
providing a vehicle condition signal from the vehicle to the device;
while the transport vehicle is moving, transmitting to the device inside the mobile anechoic chamber mounted to the transport vehicle an inside positioning signal;
while the transport vehicle is moving, transmitting to the device inside the mobile anechoic chamber mounted to the transport vehicle an interference signal; and
monitoring the device to determine its ability to utilize the inside positioning signals and the vehicle condition signal to resist the interference signal inside the mobile anechoic chamber mounted to the transport vehicle while the transport vehicle is moving.

* * * * *